United States Patent [19]
Ushida et al.

[11] Patent Number: 5,754,340
[45] Date of Patent: May 19, 1998

[54] PROJECTION OPTICAL SYSTEM AND PROJECTION EXPOSURE APPARATUS USING THE SAME

[75] Inventors: Kazuo Ushida; Koichi Matsumoto, both of Tokyo, Japan

[73] Assignee: Nikon Corporation, Japan

[21] Appl. No.: 496,551

[22] Filed: Jun. 29, 1995

[30] Foreign Application Priority Data

Jun. 30, 1994 [JP] Japan ................................. 6-170376

[51] Int. Cl.⁶ .......................... G02B 5/18; G02B 27/44; G02B 13/14
[52] U.S. Cl. .......................... 359/566; 359/355; 359/565; 359/350
[58] Field of Search .......................... 359/355, 565, 359/566, 742, 361, 569; 355/53, 240

[56] References Cited

U.S. PATENT DOCUMENTS

| | | | |
|---|---|---|---|
| 5,046,838 | 9/1991 | Iwasaki | 359/742 |
| 5,121,255 | 6/1992 | Hayshi | 359/355 |
| 5,170,207 | 12/1992 | Tezuka et al. | |
| 5,386,319 | 1/1995 | Whitney | 359/565 |
| 5,623,365 | 4/1997 | Kuba | 359/569 |

OTHER PUBLICATIONS

Miyaji et al. tutorial review "Excimer Lithography for ULSI" in Optical and Quantum Electronics 25 (1993) 297–310.

Nishida "Achromatic Lens by Combining Diffraction Grating and Refractive Lenses" extracted from Shashin Kogyo, Mar. 1994.

*Primary Examiner*—Paul M. Dzierzynski
*Assistant Examiner*—Audrey Chang
*Attorney, Agent, or Firm*—Pennie & Edmonds LLP

[57] ABSTRACT

The projection optical system of the present invention decreases particularly the secondary spectrum of chromatic aberration and minimizes restrictions on lens design. The projection optical system of a projection exposure apparatus which irradiates a light beam from a light source on a mask to expose a pattern of the mask onto a photosensitive substrate through the projection optical system has at least one diffraction optical element, at least one quartz lens, and at least one fluorite lens. The diffraction optical element has a positive power, the quartz lens has a negative power, and the fluorite lens has a positive power. An Ar—F laser is preferably used as a light source.

15 Claims, 4 Drawing Sheets

PROJECTION OPTICAL SYSTEM AND PROJECTION EXPOSURE APPARATUS USING THE SAME

BACKGROUND OF THE INVENTION

1. Field of the Invention

The present invention relates to a projection optical system which decreases the secondary spectrum of a chromatic aberration while maintaining advantages of use of a diffraction optical element, and a projection exposure apparatus using this projection optical system.

2. Related Background Art

Conventionally, the so-called lithography process with transfer and exposure of a predetermined pattern is applied to manufacture semiconductor elements such as ICs and LSIs, liquid crystal elements, or members with micropatterns, such as thin-film magnetic heads. In this process, an exposure light beam is projected onto a photosensitive substrate such as a silicon wafer from a mask having a predetermined circuit pattern through a projection optical system, thereby transferring the pattern on the mask onto the wafer.

A high resolving power is required to the projection exposure apparatus used to transfer and expose such a micropattern. Since the resolving power of such an optical system is associated with the wavelength of a light beam from a light source to be used, the wavelength of a light beam from a light source tends to be shortened. Currently, a light beam in an ultraviolet (or deep ultraviolet) wavelength range as in a Kr-F laser (wavelength: 248 nm) and an Ar-F laser (wavelength: 193 nm), both of which are so-called excimer lasers, is actually used.

SUMMARY OF THE INVENTION

A projection exposure apparatus of the present invention irradiates a light beam from a light source on a mask, thereby exposing a pattern on the mask onto a photosensitive substrate through a projection optical system. The projection optical system has at least one diffraction optical element, at least one quartz lens, and at least one fluorite lens.

It is preferable that at least one of diffraction optical elements has a positive power, at least one of quartz lenses has a negative power, and at least one of fluorite lenses has a positive power.

An Ar-F laser (central wavelength: 193 nm) is preferably used as a light source means.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Figure 1:
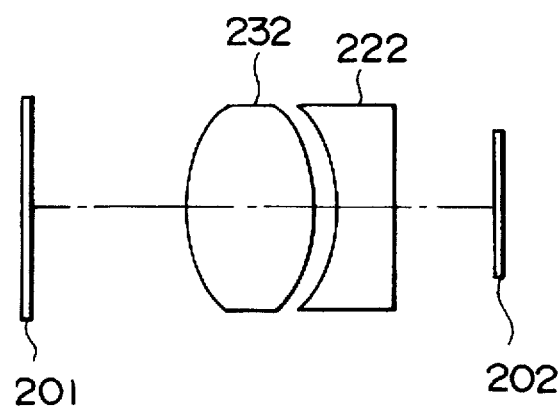
FIG. 1 is a view schematically showing the arrangement of a chromatic aberration correction optical system constituted by combining a quartz lens and a fluorite lens.

For so-called semiconductor integrated circuits, high integration is in progress as observed as a shift from conventional ICs or LSIs to VLSIs or ULSIs in recent years. Accordingly, a much higher resolving power has been required. For this reason, the countermeasures for higher integration are required, e.g., utilization of a light beam having a shorter wavelength, and studies have been made on utilization of an $F_2$ laser (wavelength: 157 nm) or an X-ray.

As a method of meeting the requirement for higher integration, the wavelength of a light beam from a light source is shortened. To simultaneously improve the precision of the optical system itself, it is essential to appropriately correct the aberrations. As for a chromatic aberration, some are caused by limitation of the spectral width of a light beam from a light source while some are caused by the projection optical system. Ideally, when the spectral width of a light beam from a light source is zero (i.e., the light beam has a single wavelength), no chromatic aberration occurs, though it is impossible. However, to realize the similar situation, various methods have been examined to improve the technique of narrowing the spectral width.

The spectral width of a Kr-F laser (wavelength: 248 nm) is normally about 0.3 nm (FWHM: Full Width at Half Maximum). A narrow-band excimer laser having a spectral width of about 1.0 to 1.5 pm (FWHM) has been developed by arranging a wavelength selection element such as a prism, a diffraction grating, or an etalon in the oscillator of the laser (Optical and Quantum Electronics Vol. 25 (1993) pp. 297-310). With this arrangement, the influence of chromatic aberration is minimized.

When the projection optical system corresponding to a light source having a short wavelength is constituted by a conventional refraction lens, sufficient imaging characteristics cannot be obtained because of the refractive index or transmittance. More specifically, the requirement for higher integration by shortening the wavelength cannot be sufficiently coped with only the conventional transmission refraction type optical element or correction means.

A projection optical system using a reflecting member has also been put into practice. However, it is very difficult to form a reduction type projection optical system which can be effectively used to transfer a micropattern because of the reflection characteristics of a spherical mirror or the like, so a practical optical system cannot be formed.

When a normal Kr-F laser (wavelength: 248 nm) is used as a light source, the spectral width is about 0.3 nm, as described above. For this spectral width, a chromatic aberration caused by the projection optical system must be corrected. Therefore, the projection optical system requires at least two optical materials which exhibit different dispersions.

An excimer laser beam from the Kr-F laser or the like has a very short wavelength (in deep ultraviolet range). For this reason, when normal glass is used as the glass material of the lens, a sufficient transmittance cannot be obtained. When the optical material of this type is used to the projection optical system, not only a sufficient exposure intensity cannot be obtained, but also a non-transmission light amount is absorbed by the optical material to cause heat variations. Therefore, normal glass cannot be used as the glass material of the projection optical system.

When an excimer laser beam in the deep ultraviolet range is to be used as a light beam from a light source, materials usable as the glass material of the lens and the like are almost limited to quartz ($SiO_2$) and fluorite ($CaF_2$) from the viewpoint of transmittance. Therefore, a chromatic aberration correction optical system (projection optical system) using the two optical materials, i.e., quartz and fluorite, has been examined, which is described in detail in "Challenge to Achromatic Lens: Optical System Using State-Of-The-Art Lasers" (Satoru Anzai, Nikkei Microdevice, 1987. Feb. pp. 103–112).

A projection optical system using a narrow-band excimer laser (Kr-F) having a spectral width of about 1.0 to 1.5 pm (FWHM) as a light source is constituted by a monochromatic lens formed of only quartz. This structure is typical in current excimer projection optical systems. With such a monochromatic lens, the chromatic aberration cannot be corrected. Even if the spectral width is narrow as in the above-described range, the chromatic aberration causes an image blur corresponding to about 0.11 to 0.165% of the focal length of the projection optical system along the optical axis (the detail will be described later).

In recent years, diffraction optical elements have received a great deal of attention as optical elements. The diffraction optical element is an optical element for deflecting the optical path by using a diffraction function. With the diffraction optical element, the optical path of a light beam having a short wavelength can be arbitrarily deflected. Additionally, since this optical element exhibits wavelength vs. deflection characteristics different from those of a so-called refraction lens, a new aberration correction means combined with the refraction lens has received a great deal of attention.

A Fresnel zone plate or the like is known well as a diffraction optical element. A general Fresnel zone plate has a structure in which light-shielding members are concentrically arranged on a transparent substrate. The Fresnel zone plate uses the diffraction function of the light beam from the transparent area to focus the light beam to a predetermined position.

As for diffraction optical elements including a zone plate, not only the above structure having a transparent portion and a light-shielding portion, but also a structure in which areas with different transmission characteristics (refractive index, transmission distance, and the like) are formed stepwise, or a structure in which a portion with different transmission characteristics due to refractive index distribution is arranged in the substrate is known. The former is represented by a so-called binary optical element (BOE), and the latter is represented by a so-called hologram optical element (HOE).

In the BOE, a stepped surface shape is formed on a transparent member by using the lithography process (it may be formed on the surface of a reflecting member) to partially change the transmission distance, thereby obtaining the diffraction function. The BOE has an advantage in its manufacturing method because an arbitrary micropattern can be precisely and freely formed, and particularly its application field has received a great deal of attention (Shashin Kogyo, 1994. March. p. 94).

According to an advanced diffraction optical element such as a BOE, diffracted light has a convergence function to one point, as is well known. In addition, a free diffraction function can be obtained such that an arbitrary light wave surface is converted into a desired light wave surface, a light divergence function is obtained, and a light convergence function and a beam splitting function are composed.

Studies have been made on applications of the BOE as the optical member of a projection optical system because the thin and lightweight BOE facilitates mass production and manufacturing to obtain a high diffraction function, light is highly utilized, and, even for a light beam in the deep ultraviolet range, the optical path can be deflected.

Japanese Patent Laid-Open No. 4-214516 discloses a projection optical system (projection lens system) using a Fresnel lens as an aberration correction member. This prior art uses a Fresnel lens having a conventionally well known structure (the lens has a spherical or aspherical lens surface formed by concentric grooves). Only quartz is selected as the glass material of the lens constituting the projection optical system. A currently generally used Kr-F laser (wavelength: 248 nm) or Ar-F laser (wavelength: 193 nm) serves as a light source.

As described above, the chromatic aberration correction optical system (projection optical system) examined in the projection optical system of the projection exposure apparatus using an excimer laser as a light source has a structure formed of two optical materials, i.e., quartz and fluorite, or quartz and a Fresnel lens, or a single lens structure formed of only quartz.

In the chromatic aberration correction optical system using quartz and fluorite, however, the dispersions (or Abbe's numbers) of quartz and fluorite are not so different. Therefore, to correct the chromatic aberration, the fluorite lens must have a large positive power while the quartz lens must have a large negative power.

FIG. 1 is a view schematically showing the arrangement of the chromatic aberration correction optical system constituted by combining a quartz lens and a fluorite lens. Referring to FIG. 1, as an optical system for projecting a pattern on a photomask 201 onto a photosensitive substrate 202, chromatic aberration correction is achieved by combining a fluorite lens 232 having a large positive power and a quartz lens 222 having a large negative power.

In the projection optical system with the above arrangement, a resolution of about 0.2 μm, which is required to a 256-Mbit DRAM, can be reproduced in a field with a size about several mm square by using an Ar-F laser (wavelength: 193 nm). However, when an exposure field with a practical size of about 20 mm square is to be ensured, this resolution cannot be achieved.

The reason for this is as follows. Since the lens surface must have a small radius of curvature because of the large power of the refraction lens, the aperture of the lens is naturally limited. This means that the NA (numerical aperture) and field (projection area) of the projection optical system with the above arrangement are limited.

Such limitations pose a large obstruction in optical design although a larger NA for improving the resolution, or a larger field necessary for transfer and exposure of a large element such as a liquid crystal element is required to improve specifications. When a lens surface with a small radius of curvature is to be formed, eccentricity tolerance of the lens element becomes strict. For this reason, it is very difficult to assemble the lens, which poses a difficulty in constituting a projection optical system by a quartz lens and a fluorite lens.

The projection optical system using the above-described narrow-band excimer laser (Kr-F) with a spectral width of about 1.0 to 1.5 pm (FWHM) as a light source is generally constituted by a monochromatic lens using only a quartz lens. Such a monochromatic lens cannot correct the chromatic aberration. Therefore, this system can be used on the assumption that the spectral width of the laser s narrowed.

However, when an Ar-F excimer laser as an excimer laser with a short wavelength is used as a light source, and the projection optical system is constituted by a monochromatic lens of only quartz, the chromatic aberration caused by the spectral width becomes about 2.6 times that of the Kr-F excimer laser. Therefore, when this system is to be used with almost the same chromatic aberration as that of the Kr-F laser, the spectral width of the Ar-F excimer laser must be about 1/2.6 that of the Kr-F excimer laser. In consideration of the durability of the optical member constituting the laser oscillator, this narrowing can hardly be realized.

A projection optical system including the Fresnel lens, as disclosed in Japanese Patent Laid-Open No. 4-214516, is proposed in consideration of the above situations. The Fresnel lens has a reciprocal dispersion unlike a refraction lens. Therefore, when the Fresnel lens has a positive power, the chromatic aberration can be corrected while a normal refraction lens formed of optical glass keeps to have a small positive power.

Figure 2:
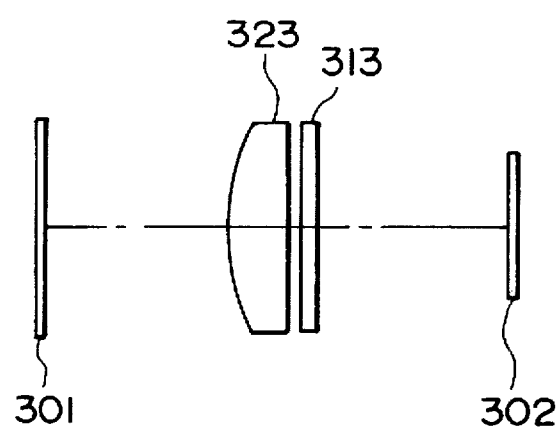
FIG. 2 is a view schematically showing the arrangement of a projection optical system having a quartz lens and a diffraction optical element.

FIG. 2 is a view schematically showing the arrangement of the projection optical system. Referring to FIG. 2, an optical system for projecting a pattern on a photomask 301 onto a photosensitive substrate 302 is constituted by a quartz lens 323 and a diffraction optical element 313. With this arrangement, both the diffraction optical element 313 and the quartz lens 323 have a positive power. However, since these elements exhibit dispersions reciprocal to each other, the chromatic aberration is corrected.

The absolute value of the power of the quartz lens 323 can be decreased as compared to the arrangement shown in FIG. 1. This means that the radius of curvature can be increased. As for optical design, a margin for improving specifications can be obtained to realize a larger NA or a larger field. In addition, as for manufacturing, the eccentricity tolerance is increased to facilitate the manufacture.

However, with this arrangement of the optical system, the secondary spectrum of the chromatic aberration is large. The secondary spectrum here means the amount of chromatic aberration remaining at a wavelength near the current target wavelength (light source wavelength) on the assumption that the normal chromatic aberration is corrected ($\partial f/\partial \lambda = 0$ is satisfied). More specifically, a blur $\delta f$ in the direction of the optical axis based on the secondary spectrum of a focal length f of the optical system can be represented by the following equation (1) using two-time differentiation of the focal length f with respect to a wavelength $\lambda$:

$$\delta f = \frac{1}{2} \cdot (\partial^2 f/\partial \lambda^2) \cdot (\delta \lambda/2)^2 \tag{1}$$

where $\delta \lambda$ represents the spectral width (FWHM) of the light source.

Figure 3:
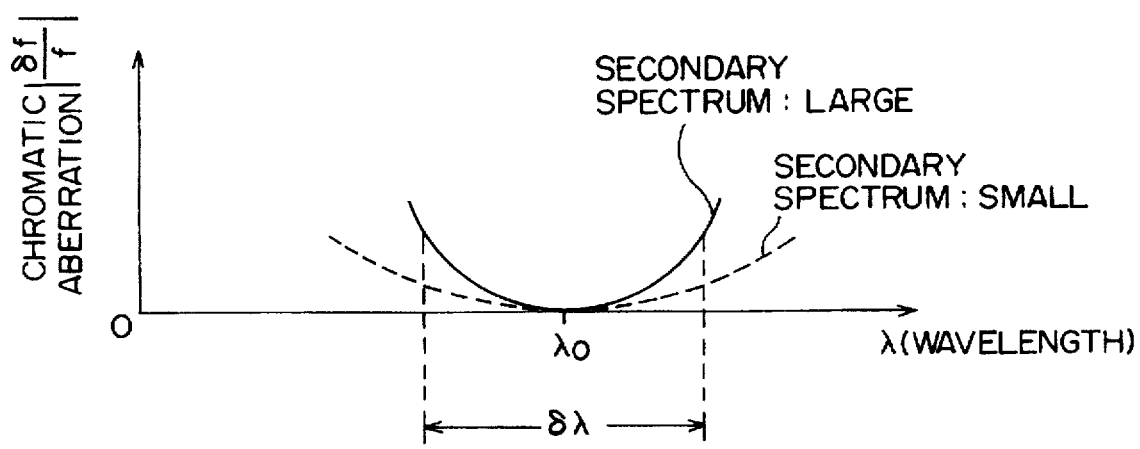
FIG. 3 is a graph showing the relationship between a spectral width and a chromatic aberration.

The relationship between the spectral width and the chromatic aberration will be described below with reference to FIG. 3. In FIG. 3, the wavelength $\lambda$ of the light beam from the light source is plotted along the abscissa, and the magnitude (absolute value) of a chromatic aberration $\delta f/f$ based on the secondary spectrum is plotted along the ordinate. Optical design is normally made at a light source (central) wavelength $\lambda_0$. Although the chromatic aberration at the wavelength $\lambda_0$ is zero, it is found that the chromatic aberration remains at the wavelength near the wavelength $\lambda_0$ (within a range of $\delta \lambda$), as indicated by a solid or dotted line in FIG. 3.

The solid and dotted lines indicate different secondary spectrums near the wavelength $\lambda_0$. Even when an excimer laser is used as a light source, the laser beam also has a certain spectral width $\delta \lambda$. Therefore, the magnitude of the secondary spectrum is a factor for determining the imaging performance.

The projection optical system of the present invention is mounted in a projection exposure apparatus which irradiates a light beam from a light source means onto a mask, thereby exposing a pattern on the mask onto a photosensitive substrate through the projection optical system. The projection optical system has at least one diffraction optical element, at least one quartz lens, and at least one fluorite lens. The diffraction optical element deflects the optical path by the diffraction function and has a dispersion reciprocal to that of a refraction lens.

For this reason, in the projection optical system of the present invention, the diffraction optical element is used together with a quartz lens or a fluorite lens as a refraction lens. With this arrangement, optical elements having different dispersions are used to correct the chromatic aberration. Particularly, a projection exposure apparatus having imaging characteristics representing a small secondary spectrum of the chromatic aberration is realized by combining these elements.

The reciprocal dispersion characteristics of the diffraction optical element with respect to the refraction lens will be described. When normal refraction and reflecting systems including the diffraction optical element of this type is to be considered, the diffraction optical element can be replaced with a refraction lens having an infinitesimal thickness and an infinite refractive index. The details are described in the paper of W. C. Sweatt (J. Opt. Soc. Am. vol. 69, No. 3, p. 486 (1979)).

According to this paper, when the diffraction optical element is regarded as a lens, the ray tracing formula representing the behavior of a light beam is given as the following equation (2):

$$(n-1) \cdot (dt/ds) = \sin \theta_1 - \sin \theta_2 \tag{2}$$

where $\theta_1$ is the incident angle of the light beam incident on this lens, $\theta_2$ is the exit angle, t is the coordinate in the direction of optical axis, and s is the coordinate in the direction along the lens surface.

On the other hand, the following equation (3) can be obtained from diffraction of the light beam:

$$m \cdot \lambda/p = \sin \theta_1 - \sin \theta_2 \tag{3}$$

where m is the order of diffraction, $\lambda$ is the wavelength, and p is the pitch of the grating.

The following equation (4) is obtained from equations (2) and (3):

$$m \cdot \lambda/p = (n-1) \cdot (dt/ds) \quad (4)$$

When equation (4) is logarithmically differentiated with respect to the wavelength λ (logarithms on both the sides are calculated, and differentiation with respect to λ is performed), the following differential equation (5) can be obtained, and its solution is represented by equation (6):

$$\partial n/\partial \lambda = (n-1)/\lambda \quad (5)$$

$$n(\lambda) = 1 + ((n_0-1)/\lambda_0) \cdot \lambda \quad (6)$$

where $\lambda_0$ is the reference wavelength, and $n_0$ is the refractive index at the reference wavelength. Since it is assumed that the lens has a refractive index $n \to \infty$, a sufficiently large positive number is practically set as $n_0$.

In the diffraction optical element as a lens having a refractive index $n \to \infty$, the dispersion $\partial n/\partial \lambda$ of the refractive index is a positive number in accordance with equation (5). As is well known, a normal optical glass has a negative value as $\partial n/\partial \lambda$. Therefore, this diffraction optical element is said to have a reciprocal dispersion.

The function of the projection optical system which combines the reciprocal dispersion of the diffraction optical element and different (regular) dispersions of quartz and fluorite will be described below. For the descriptive convenience, a thin-walled adhesion system will be considered. In the following description, the refractive indices of quartz, fluorite, and the diffraction optical element are respectively represented by $n_Q$, $n_C$, and $n_D$, and the total curvatures are respectively represented by $C_Q$, $C_C$, and $C_D$.

When the projection optical system is constituted by a quartz lens, a fluorite lens, and a diffraction optical element, the reciprocal 1/f of the focal length f of the entire system, i.e., the power can be represented by the following equation (7):

$$1/f = (n_Q-1) \cdot C_Q + (n_C-1) \cdot C_C + (n_D-1) \cdot C_D \quad (7)$$

If the chromatic aberration is to be corrected at the current target wavelength (light source wavelength) $\lambda_0$, an equation obtained by differentiating equation (6) with respect to the wavelength λ must become zero, i.e., the following equation (8) must be satisfied:

$$\begin{aligned}-1/f^2 \cdot (\delta f/\delta \lambda) \\ = C_Q \cdot (\delta n_Q/\delta \lambda) + C_C \cdot (\delta n_C/\delta \lambda) + C_D \cdot (\delta n_D/\delta \lambda) \\ = 0\end{aligned} \quad (8)$$

Even when the equation (8) is satisfied with respect to the wavelength $\lambda_0$, and the primary chromatic aberration is corrected, the chromatic aberration remains at a wavelength ($\lambda_0 \pm \delta \lambda/2$) near the wavelength $\lambda_0$ because the light source has a certain spectral width (δλ: FWHM). This chromatic aberration residual amount (called a secondary spectrum) is an important factor for determining the imaging performance, so it cannot be neglected and must be sufficiently evaluated.

The secondary spectrum corresponds to an amount obtained by differentiating equation (7) twice with respect to the wavelength λ. Therefore, equation (8) must be further differentiated with respect to the wavelength. The result is represented by the following equation (9):

$$-1/f^2 \cdot (\partial^2 f/\partial \lambda^2) = C_Q \cdot (\partial^2 n_Q/\partial \lambda^2) + C_C \cdot (\partial^2 n_C/\partial \lambda^2) + C_D \cdot (\partial^2 n_D/\partial \lambda^2) \quad (9)$$

Focal lengths $f_Q$, $f_C$, and $f_D$ of the quartz lens, the fluorite lens, and the diffraction optical element, the refractive indices $n_Q$, $n_C$, and $n_D$, the total curvatures $C_Q$, $C_C$, and $C_D$ satisfy the following relations (10) to (12):

$$1/f_Q = (n_Q-1) \cdot C_Q \quad (10)$$

$$1/f_C = (n_C-1) \cdot C_C \quad (11)$$

$$1/f_D = (n_D-1) \cdot C_D \quad (12)$$

When equations (10) to (12) are substituted into equations (7) to (9), the following equations (13) to (15) are obtained:

$$\begin{aligned}1/f &= 1/f_Q + 1/f_C + 1/f_D \quad (13)\\ -1/f^2 \cdot (\delta f/\delta \lambda) \\ &= 1/(f_Q \cdot (n_Q - 1)) \cdot (\delta n_Q/\delta \lambda) \quad (14)\\ &\quad + 1/(f_C \cdot (n_C - 1)) \cdot (\delta n_C/\delta \lambda) \\ &\quad + 1/(f_D \cdot (n_D - 1)) \cdot (\delta n_D/\delta \lambda) \\ &= 0 \\ -1/f^2 \cdot (\delta^2 f/\delta \lambda^2) \\ &= 1/(f_Q \cdot (n_Q - 1)) \cdot (\delta^2 n_Q/\delta \lambda^2) \quad (15)\\ &\quad + 1/(f_C \cdot (n_C - 1)) \cdot (\delta^2 n_C/\delta \lambda^2) \\ &\quad + 1/(f_D \cdot (n_D - 1)) \cdot (\delta^2 n_D/\delta \lambda^2)\end{aligned}$$

The dependencies n(λ) of the refractive indices of the quartz lens, the fluorite lens, and the diffraction optical element on the wavelength are known amounts. For this reason, the one-time differentiation amount $\partial n/\partial \lambda$ of the refractive index in equation (14) with respect to the wavelength, and the two-time differentiation amount $\partial^2 n/\partial \lambda^2$ of the refractive index in equation (15) with respect to the wavelength can be obtained. Therefore, equations (13) to (15) include only three unknowns $1/f_Q$, $1/f_C$, and $1/f_D$.

The dependency $n_D(\lambda)$ of the refractive index of the diffraction optical element on the wavelength is represented by the above equation (6). When equation (6) is differentiated by the wavelength λ, the following equations (16) and (17) are obtained:

$$(1/(n_D-1)) \cdot (\partial n_D/\partial \lambda) = 1/\lambda \quad (16)$$

$$\partial^2 n_D/\partial \lambda^2 = 0 \quad (17)$$

As for the dependency of the refractive index $n_Q$ of quartz on the wavelength λ, the following equation (18) is quoted from the paper of I. H. Malitson (J. Opt. Soc. Am. vol. 55, No. 10, p. 1205 (1965)):

$$\begin{aligned}n_Q^2 - 1 &= 0.6961663 \cdot \lambda^2/(\lambda^2 - (0.0684043)^2) \quad (18)\\ &\quad + 0.4079426 \cdot \lambda^2/(\lambda^2 - (0.1162414)^2) \\ &\quad + 0.8974794 \cdot \lambda^2/(\lambda^2 - (9.896161)^2)\end{aligned}$$

As for the dependency of the refractive index $n_C$ of fluorite on the wavelength λ, the Following equation (19) is quoted from the paper of I. H. Malitson (Appl. Opt. vol. 2, No. 10, p. 1103 (1963)). Note that the unit of the wavelength λ in equations (18) and (19) is μm:

$$\begin{aligned}n_C^2 - 1 &= 0.5675888 \cdot \lambda^2/(\lambda^2 - (0.050263605)^2) \quad (19)\\ &\quad + 0.4710914 \cdot \lambda^2/(\lambda^2 - (0.1003909)^2) \\ &\quad + 3.8484723 \cdot \lambda^2/(\lambda^2 - (34.649040)^2)\end{aligned}$$

When the one-time differentiation amounts of the refractive index $n_Q$ of quartz and the refractive index $n_C$ of fluorite with respect to the wavelength, which are obtained from equations (16), (18), and (19), are substituted into equation (14), all the coefficients of simultaneous equations constituted by equations (13) and (14) are determined. In this case, there are three unknowns $1/f_Q$, $1/f_C$, and $1/f_D$, and one degree of freedom remains. This degree of freedom is treated as a variable, the secondary spectrum amount represented by equation (15) can be evaluated. In this manner, consideration of the focal lengths $f_Q$, $f_C$, and $f_D$ of the quartz lens, the fluorite lens, and the diffraction optical element can be made.

For example, when $1/f$, associated with the diffraction optical element was treated as a variable, and the secondary spectrum was evaluated, the following result was obtained (the details will be described in the embodiment).

Instead of constituting the projection optical system by two constituent elements, i.e., the quartz lens and the diffraction optical element, as in FIG. 2 (i.e., the fluorite lens has no power: $f_C=\infty$), the fluorite lens is also caused to have a power ($f_C \neq \infty$). With this arrangement, the secondary spectrum amount can be decreased by combining three constituent elements, i.e., the quartz lens, the fluorite lens, and the diffraction optical element. More specifically, the chromatic aberration at a wavelength near the wavelength $\lambda_0$ of the light source (wavelength other than the central wavelength in the wavelength band) can also be satisfactorily corrected, thereby constituting an excellent projection optical system.

It is preferable that at least one of the diffraction optical elements constituting the projection optical system have a positive power, at least one of the quartz lenses have a negative power, and at least one of the fluorite lenses have a positive power.

In this specification, the positive power of the diffraction optical element is an expression of the deflection function of the diffraction optical element in correspondence with the refraction lens. In this element, the diffraction function acts such that the light beam whose optical path is deflected by the element propagates in the direction of convergence. To the contrary, the negative power of the diffraction optical element means that the light beam whose optical path is deflected by the element having a function of deflecting the optical path in the direction of divergence.

As described above, $1/f_D$ associated with the diffraction optical element was treated as a variable, and the secondary spectrum was evaluated with respect to combinations of the focal lengths $f_Q$, $f_C$, and $f_D$ of the three constituent elements.

As a result, combinations for completely eliminating the secondary spectrum can also be obtained. In this case, however, the lens powers of the quartz lens and the fluorite lens are increased to undesirably limit the apertures of the lens. In addition, when the lens power is large, the manufacture becomes difficult.

Practically, the secondary spectrum is preferably decreased in a practical range, and a combination of $f_Q<1$, $f_C>0$, and $f_D>0$ is preferable to decrease the lens power.

In other words, the diffraction optical element has a positive power (convergence characteristics), the quartz lens has a negative power, and the fluorite lens has a positive power. When at least one set of these combinations is provided to the optical system, a practical projection optical system capable of satisfactorily correcting the secondary spectrum can be formed.

In the projection optical system constituted by the combinations in this range, the chromatic aberration (secondary spectrum) at a wavelength near the light source wavelength $\lambda_0$ can be corrected to a practical level. In addition, the optical element (lens) can be easily manufactured because lenses having a smaller power can be used. Furthermore, when the lens power is small, an element having a large lens aperture can be used. Therefore, the NA (numerical aperture) of the projection optical system can be increased or its field (projection area) can be extended, resulting in improvement of the resolution (resolving power).

An Ar-F laser (central wavelength: 193 nm) is preferably used as a light source means. In this case, the following function is obtained.

The Ar-F laser (wavelength: 193 nm) is a light source having a shorter wavelength than that of a Kr-F laser (wavelength: 248 nm) which is the most generally used excimer laser source, and expected as a light source for coping with the requirement for a higher resolving power of the projection optical system. However, when the wavelength of the light source is shortened, the secondary spectrum amount largely increases even at the same wavelength width (spectral width). For this reason, in the projection optical system using a light beam having such a short wavelength, correction of the secondary spectrum amount becomes more important. Particularly, the spectral width of the Ar-F laser is extremely large.

In the present invention, the Ar-F laser is used in the projection optical system constituted by the three constituent elements, i.e., the quartz lens, the fluorite lens, and the diffraction optical element. Even when the spectral width of the light source is large, practical correction of the chromatic aberration can be performed by decreasing the secondary spectrum amount. In addition, with the arrangement for satisfactorily correcting the chromatic aberration, as in the above arrangement, the absolute value of each lens power can be minimized. Therefore, a projection exposure apparatus having an improved resolving power can be realized.

Of the light source means currently usable as a light source, the Ar-F laser has almost the limit of the light sources usable in the projection optical system using the refraction lens, from the viewpoint of the refraction properties or transmittance of a transmission refraction type optical element (e.g., a lens). An $F_2$ laser (wavelength: 157 nm) and the like are known as a light source having a shorter wavelength. However, it is difficult to use these lasers in the transmission refraction type projection optical system.

With the Kr-F laser (wavelength: 248 nm), the projection optical system constituted by only the quartz lens can be used by narrowing the laser. However, with the Ar-F laser (wavelength: 193 nm) having a shorter wavelength, band narrowing of the laser is not necessarily promising, and the laser is not put into practice yet. According to the present invention, however, the projection optical system using the Ar-F laser can be formed. According to the projection exposure apparatus having this system, a finer pattern than that in the prior art can be transferred and exposed, and semiconductor elements having a higher degree of integration can be manufactured.

First Embodiment

Figure 4:
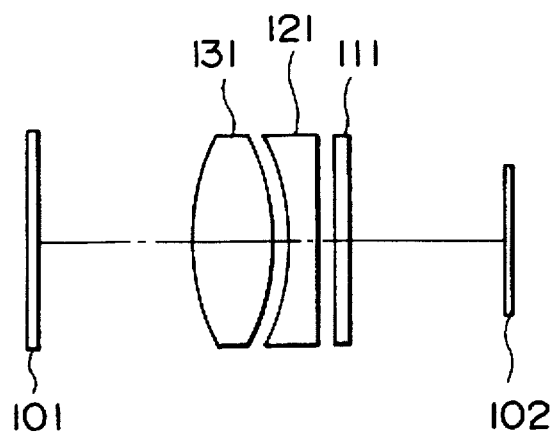
FIG. 4 is a view schematically showing the arrangement of a projection optical system according to the first embodiment.

FIG. 4 is a view schematically showing the projection optical system of a projection exposure apparatus using an Ar-F excimer laser ($\lambda=193$ nm) as a light source, as the first embodiment. The projection optical system in FIG. 4 is constituted by three constituent elements, i.e., a diffraction optical element 111, a quartz lens 121, and a fluorite lens 131. An exposure light beam from the Ar-F excimer laser (not shown) is projected onto a photosensitive substrate 102 through a photomask 101 and the above projection optical system. In the entire apparatus, the pattern on the mask is transferred and exposed onto the photosensitive substrate.

The function of the projection optical system is the same as in the above description. The relation between the power (reciprocal of focal length) of the projection optical system and the power of each constituent element is given by equation (13), the chromatic aberration correction condition is given by equation (14), and the secondary spectrum amount is given by equation (15). These equations include three unknowns, i.e., the power $1/f_Q$ of the quartz lens, the power $1/f_C$ of the fluorite lens, and the power $1/f_D$ of the diffraction optical element. Each coefficient is defined by using the wavelength of the exposure light as a parameter.

In this embodiment, since the Ar-F excimer laser is used as the exposure light source, each coefficient can be obtained at the wavelength $\lambda=0.193$ μm using equations (18) and (19). The refractive indices of quartz and fluorite, and the wavelength differentiation amounts thereof at a wavelength $\lambda=193$ nm are as follows:

$$n_Q=1.560769 \tag{20}$$

$$n_C=1.501532 \tag{21}$$

$$\partial n_Q/\partial \lambda = -1.5906 \tag{22}$$

$$\partial n_C/\partial \lambda = -0.97993 \tag{23}$$

$$\partial^2 n_Q/\partial \lambda^2 = 184.41 \tag{24}$$

$$\partial^2 n_C/\partial \lambda^2 = 106.73 \tag{25}$$

Using the above values, simultaneous equations are formed by equations (13) and (14), and the secondary spectrum (equation (15)) in the apparatus of this embodiment will be evaluated below. At this time, the power $1/f_D$, of the diffraction optical element is treated as a variable.

Figure 5:
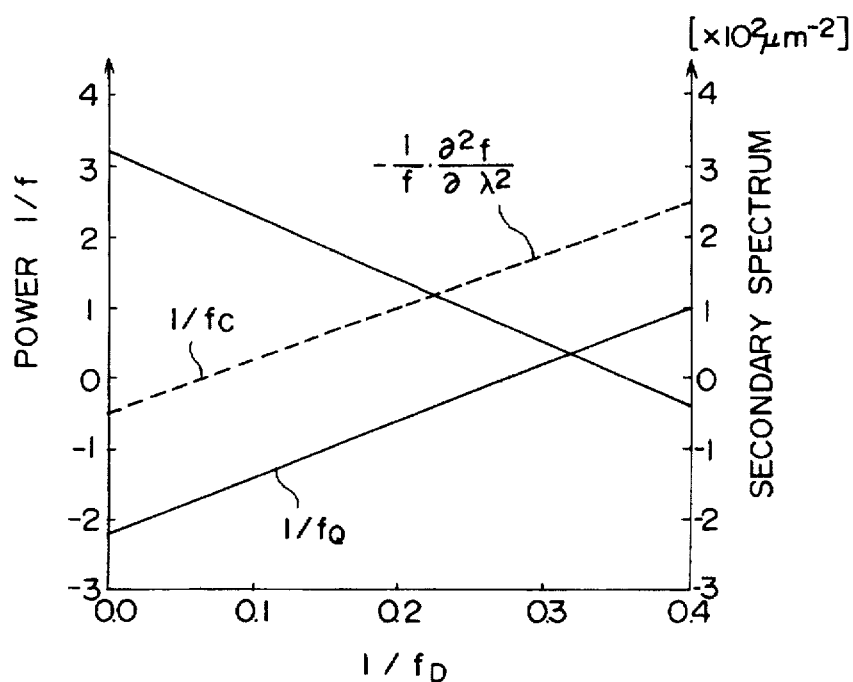
FIG. 5 is a graph showing the relationship among the power of the diffraction optical element, and the powers and secondary spectrum amounts of the quartz and fluorite lenses.

FIG. 5 is a graph in which the power of the diffraction optical element is plotted along the abscissa, the power ($1/f_Q$) of the quartz lens and the power ($1/f_C$) of the fluorite lens are plotted along the ordinate on the left side, and the secondary spectrum amount ($-1/f \cdot (\partial^2 f/\partial \lambda^2)$) is plotted along the ordinate on the right side. In this case, normalization was performed such that the power ($1/f$) of the projection optical system becomes one.

Referring to FIG. 5, it is found that, as the combination of the optical system with the diffraction optical element having no power ($1/f_D=0$) is gradually changed to a combination with the diffraction optical element having a positive power, the absolute values of the powers of the quartz lens having a negative power and the fluorite lens having a positive power gradually decrease. It is also found that the secondary spectrum changes from a negative value to a positive value first, and then, monotonically increases.

Referring to FIG. 5, when $1/f_D=0$, the diffraction optical element can be regarded equivalent to a plane-parallel plate, and such a system corresponds to a chromatic aberration correction optical system constituted by only the quartz lens and the fluorite lens. At this time, the following values can be obtained as the power of the quartz lens, the power of the fluorite lens, and the secondary spectrum amount:

$$1/f_D=0 \tag{26}$$

$$1/f_Q=-2.214 \tag{27}$$

$$1/f_C=3.214 \tag{28}$$

$$(-1/f)\cdot(\partial^2 f/\partial \lambda^2)=-0.441 \times 10^2 \tag{29}$$

The following results can be obtained from these values. Even in the chromatic aberration correction optical system having no diffraction optical element, the secondary spectrum amount can be suppressed to a smaller value. However, since the absolute values of the powers of the quartz lens and the fluorite lens are large, the lens surface must have a small radius of curvature. Therefore, the eccentricity tolerance of the lens element becomes strict, and it also makes it difficult to assemble and manufacture the lens. In addition, since the lens aperture becomes smaller, no larger field can be obtained.

On the other hand, the chromatic aberration correction optical system constituted by only the quartz lens and the diffraction optical element corresponds to a point satisfying $1/f_C=0$. The powers of the quartz lens and the diffraction optical element at this time can be read from intersections where a perpendicular crosses the point of $1/f_C=0$, and the following values can be obtained:

$$1/f_D=0.354 \tag{30}$$

$$1/f_Q=0.646 \tag{31}$$

$$1/f_C=0 \tag{32}$$

$$(-1/f)\cdot(\partial^2 f/\partial \lambda^2)=2.13 \times 10^2 \tag{33}$$

In this chromatic aberration correction optical system, the absolute values of the lens powers become smaller than those in the above-described optical system constituted by the quartz lens and the fluorite lens. Therefore, this arrangement can be regarded advantageous from the viewpoint of lens shape. However, the secondary spectrum amount becomes unacceptably large. In consideration of the relation with the wavelength half-width (spectral width) of the light source, it is difficult to perform exposure and projection at a practical precision.

For example, in the projection exposure apparatus using the currently generally used Kr-F excimer laser (wavelength: 248 nm) as a light source, the projection optical system is constituted by only the quartz lens. The blur amount $\delta f$ of the focal length $f$ of the entire system, which is caused by the spectral width $\delta \lambda$ of the light source, can be obtained from the differentiation amount of equation (10) and equation (18), which is represented by the following equation (34):

$$\delta f/f = 1.10 \cdot \delta \lambda \tag{34}$$

The spectral width $\delta \lambda$ of the Kr-F excimer laser is $\delta \lambda = 1.0 \times 10-3$ to $1.5 \times 10^{-3}$ (nm). When this value is substituted into equation (34), the following value (35) can be obtained:

$$\delta f/f = (1.1 \text{ to } 1.65) \times 10^{-3} \tag{35}$$

More specifically, in the projection optical system using the Kr-F excimer laser as a light source, the blur in the direction of optical axis, which is caused by the chromatic aberration, corresponds to about 0.11 to 0.165% of the focal length of the entire system.

Assume that the projection optical system constituted by the quartz lens and the diffraction optical element is used with the Ar-F excimer laser (wavelength: 193 nm) as a light source. The blur amount $\delta f$ of the focal length $f$ of the entire system at this time, which is caused by the spectral width $\delta \lambda$ of the light source, will be considered below. In this case, although the primary chromatic aberration has already been corrected, the secondary spectrum amount is large to cause chromatic aberration, as described above. The blur of the focal length in the direction of the optical axis, which is caused by the secondary spectrum, is obtained and compared with the current value (equation (35)):

$$\delta f/f = (1/f)(\frac{1}{2})(\partial^2 f/\partial \lambda^2)(\delta \lambda/2)^2 \tag{36}$$

When the value of equation (33) and the spectral width $\delta \lambda = 10 \times 10^{-3}$ (nm) of the Ar-F excimer laser are substituted into equation (36), the following value (37) is obtained:

$\delta f/f = -2.66 \times 10^3$ (37)

More specifically, in the Kr-F excimer laser projection optical system, the blur in the direction of the optical axis, which is caused by the chromatic aberration, corresponds to about 0.266% of the focal length of the entire system, which is about twice that in the above case (equation (35)). Therefore, this system has a low resolution, and it is difficult to use this system as a practical projection optical system. If the secondary spectrum amount can be suppressed to at least about ½ (about $1.0 \times 10^2$) that of equation (37), the blur in the direct on of the optical axis, which is caused by the chromatic aberration, can be decreased to the same level as in the above case.

In the chromatic aberration correction optical system constituted by the three constituent elements of this embodiment, as indicated by a solid line in FIG. 5, a lot of combinations including the above two examples are available. Of these combinations, if the power of the diffraction optical element satisfies the following condition (38) in FIG. 5, the system is improved from the viewpoint of the lens power and the secondary spectrum. Note that, in inequality (38), the magnitude of the value $f_D$ is normalized such that the focal length of the entire optical system becomes one:

$0 < 1/f_D < 0.354$ (38)

More specifically, this system is advantageous because the absolute value of each lens power is smaller than that in the chromatic aberration correction optical system constituted by only the quartz lens and the fluorite lens, and the restriction conditions for the lens shape are decreased. In addition, this system corresponds to a combination for largely decreasing the secondary spectrum amount as compared to the chromatic aberration correction optical system constituted by only the quartz lens and the diffraction optical element.

When the power of the diffraction optical element is set to the following value under the above conditions, the secondary spectrum amount can be zero:

$1/f_D = 0.06$ (39)

$1/f_Q = -1.72$ (40)

$1/f_C = 2.66$ (41)

$(-1/f) \cdot (\partial^2 f/\partial \lambda^2) = 0$ (42)

Practically, however, it is preferable that a small value be allowed on the positive side as a secondary spectrum amount, and the absolute values of the powers of the quartz lens and the fluorite lens be decreased. Particularly, in this embodiment, when the secondary spectrum amount is about $1.0 \times 10^2$, as described above, the blur of the focal length in the direction of the optical axis, which is caused by the chromatic aberration, becomes almost the same as that in the current exposure apparatus. This value can be considered as the allowance limit of the secondary spectrum. Therefore, it is more preferable that, in inequality (38), the power or the diffraction optical element satisfy the following condition (43):

$0 < 1/f_D < 0.2$ (43)

For the descriptive convenience, the lens system has been described as a thin-walled adhesion system. However, an actual lens system is a thick-walled system. In addition, a plurality of lenses having various shapes must be combined to correct aberrations other than the chromatic aberration. In this case as well, the principle of the present invention can be applied, and the gist of the present invention is to correct the chromatic aberration caused in the optical system, and particularly the secondary spectrum while including the three elements, i.e., the diffraction optical element, the quartz lens, and the fluorite lens as elements constituting the optical system.

To decrease the absolute value of the lens power to ensure an advantage in lens shape, and at the same time to decrease the secondary spectrum amount associated with the chromatic aberration, it is preferable that at least one of the diffraction optical elements constituting the optical system have a positive power, at least one of the quartz lenses have a negative power, and at least one of the fluorite lenses have a positive power.

Second Embodiment

As the second embodiment, a projection exposure apparatus using a Kr-F excimer laser ($\lambda = 248$ nm) as a light source will be considered. In this case, the projection optical system is constituted by three constituent elements, i.e., a diffraction optical element, a quartz lens, and a fluorite lens, as in the first embodiment, and its schematic explanatory view is the same as FIG. 4 used in the description of the first embodiment.

In this embodiment, the Kr-F excimer laser is used as a light source. Therefore, the refractive indices of quartz and fluorite and the wavelength differentiation amounts thereof at a wavelength $\lambda = 248$ nm can be obtained in accordance with equations (18) and (19). The results are as follows:

$n_Q = 1.508551$ (44)

$n_C = 1.468033$ (45)

$\partial n_Q/\partial \lambda = -0.56079$ (46)

$\partial n_C/\partial \lambda = -0.37347$ (47)

$\partial^2 n_Q/\partial \lambda^2 = 29.740$ (48)

$\partial^2 n_C/\partial \lambda^2 = 19.077$ (49)

Figure 6:
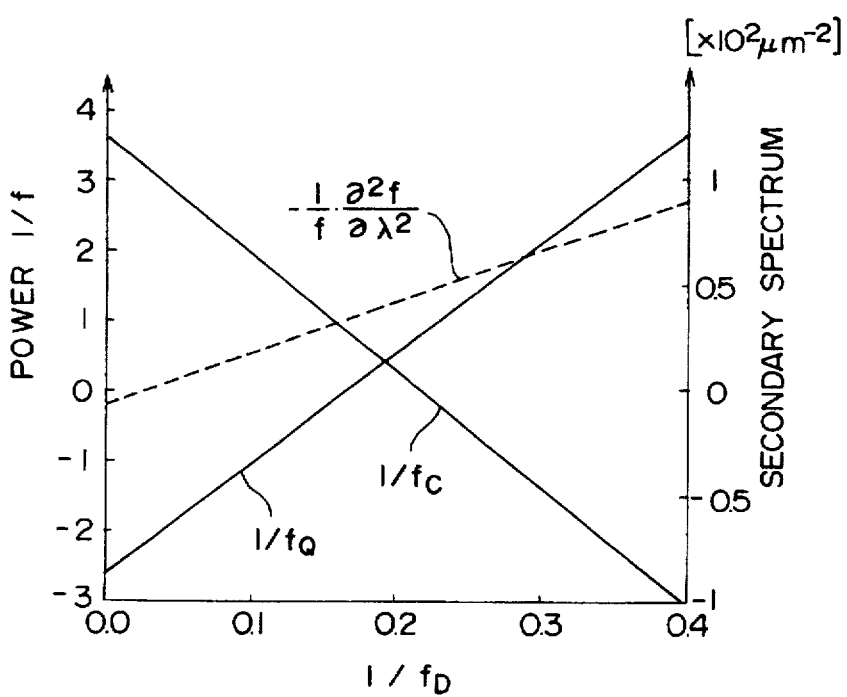
FIG. 6 is a graph showing the relationship among the power of the diffraction optical element, and the powers and secondary spectrum amounts of the quartz and fluorite lenses according to the second embodiment.

The secondary spectrum in the apparatus of this embodiment will be evaluated using the above values, as in the first embodiment. FIG. 6 is a graph in which the power of the diffraction optical element is plotted along the abscissa, the power ($1/f_Q$) of the quartz lens and the power ($1/f_C$) of the fluorite lens are plotted along the ordinate on the left side, and the secondary spectrum amount $(-1/f \cdot (\partial^2 f/\partial \lambda^2))$ is plotted along the ordinate on the right side, as in FIG. 5. In this case, normalization was performed such that the power ($1/f$) of the projection optical system becomes one.

In comparison with FIG. 5 in the first embodiment, FIG. 6 of this embodiment is characterized in that the scale of the ordinate on the right side, which represents the secondary spectrum amounts is increased. More specifically, it is found that the absolute value of the secondary spectrum amount entirely becomes smaller in this embodiment using a light source with a shorter wavelength. That is, the influence of the secondary spectrum decreases as the wavelength becomes longer.

Except for the above characteristics, the tendency is almost the same, and the following effects can be observed. As compared to an optical system constituted by only a quartz lens and a fluorite lens, the absolute value of each lens power can be decreased, resulting in an advantage in lens shape. In addition, as compared to an optical system constituted by a quartz lens and a diffraction optical element, the secondary spectrum amount can be decreased.

In the above embodiments, the powers of the diffraction optical element, the quartz lens, and the fluorite lens are represented as positive or negative powers. However, the lens powers must satisfy these conditions in at least an area near the axes of the optical elements. For example, the present invention can also be applied to an aspherical lens or a diffraction grating having a diffraction function other than convergence or divergence function, as a matter of course.

It is not limited to the Kr-F excimer laser and the Ar-F excimer laser that can be used as an ultraviolet light source supplying ultraviolet light which can be applied to the present invention. Such light sources are, for example, an $F_2$ laser which is one of gas lasers and a laser of 213 nm wavelength light which is obtained by adding 5 times higher harmonics to a YAG solid state laser emerging 1064 nm wavelength light. In the latter case, the 5 times higher harmonics of the YAG solid state laser is obtained by arranging a non linear crystal element in an oscillator in the YAG solid state laser.

Third Embodiment

Figure 7:
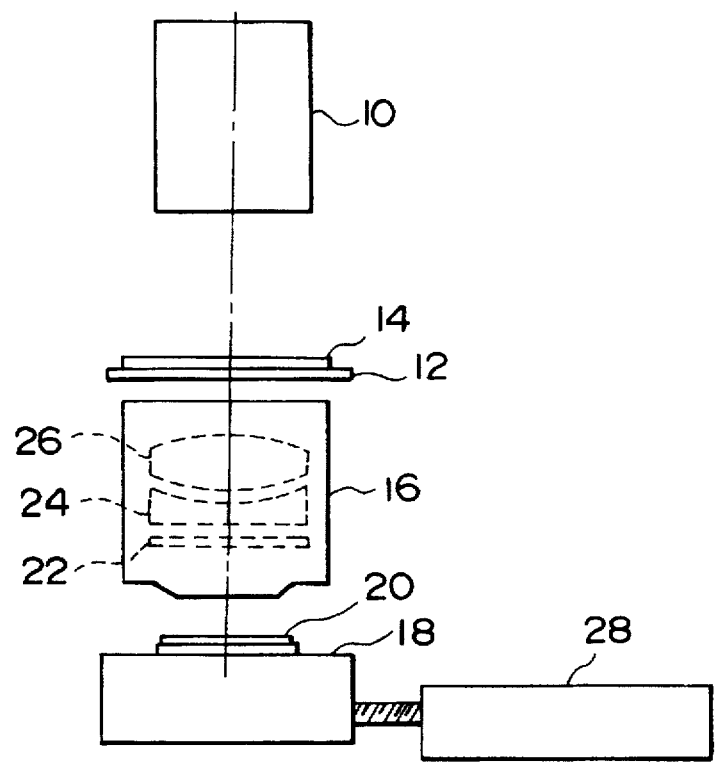
FIG. 7 is a view schematically showing the arrangement of a projection exposure apparatus according to the third embodiment, which has a projection optical system having a diffraction optical element, a quartz lens, and a fluorite lens.

A projection exposure apparatus using the above projection optical system will be described below. FIG. 7 is a view schematically showing the arrangement of this projection exposure apparatus.

An Ar-F laser beam is generated from a laser generation unit 10. This laser beam is irradiated on a photomask 14 supported by a mask stage 12. The light beam from the photomask 14 is guided, through a projection optical system 16, to a photosensitive substrate 20 supported on a substrate stage 18. With this operation, the pattern of a semiconductor element or the like, which is formed on the photomask 14, is projected onto the substrate 20 through the projection optical system 16.

The projection optical system 16 is constituted by a plurality of optical elements and incorporates at least one diffraction optical element 22, one quartz lens 24, and one fluorite lens 26. Therefore, as described above, the secondary spectrum amount becomes smaller. The blur of the focal length in the direction of the optical axis, which is caused by the secondary spectrum, is decreased, and the pattern formed on the photomask 14 is transferred onto the substrate 20 at a high resolution.

The substrate stage 18 for supporting the photosensitive substrate 20 is driven by a driving mechanism 28 in a direction perpendicular to the optical axis of the projection optical system 16, thereby sequentially transferring the pattern of the photomask 14 to a plurality of areas on the substrate 20.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 170376/1994 filed on Jun. 30, 1994 is hereby incorporated by reference.

What is claimed is:

1. An optical system acting on an incident light beam having a wavelength of not more than 250 nm, comprising:

at least one diffraction optical element having a positive power;

at least one lens formed of quartz having a negative power; and at least one lens formed of fluorite having a positive power;

wherein a secondary spectrum of said optical system is corrected by the combination of said diffraction optical element, said quartz lens and said fluorite lens.

2. A system according to claim 1, wherein a light beam incident on said optical system is an Ar-F laser beam.

3. A method for fabricating a semiconductor device, liquid crystal display device or thin film magnetic head by using the optical system according to claim 2, comprising:

a step of illuminating a mask or which a predetermined pattern is formed; and a step of projecting the pattern on the mask onto a photosensitive substrate through said optical system to expose the substrate.

4. A system according to claim 1, wherein a light beam incident on said optical system is a Kr-F laser beam.

5. A method for fabricating a semiconductor device, liquid crystal display device or thin film magnetic head by using the optical system according to claim 4, comprising:

a step of illuminating a mask on which a predetermined pattern is formed; and a step of projecting the pattern on the mask onto a photosensitive substrate through said optical system to expose the substrate.

6. A system according to claim 1, wherein said optical system is arranged between a mask having a pattern to be transferred and a photosensitive substrate and projects said pattern of said mask onto said substrate.

7. A system according to claim 1, wherein $0<1/f_D<0.354$ is satisfied where $f_D$ is a focal length of said diffraction optical element when a focal length of said entire optical system is set to be equal to one.

8. A method for fabricating a semiconductor device, liquid crystal display device or thin film magnetic head by using the optical system according to claim 7, comprising:

a step of illuminating a mask on which a predetermined pattern is formed; and a step of projecting the pattern on the mask onto a photosensitive substrate through said optical system to expose the substrate.

9. A system according to claim 1, wherein $0<1/f_D<0.2$ is satisfied where $f_D$ is a focal length of said diffraction optical element when a focal length of said entire optical system is set to be equal to one.

10. A method for fabricating a semiconductor device, liquid crystal display device or thin film magnetic head by using the optical system according to claim 9, comprising:

a step of illuminating a mask on which a predetermined pattern is formed; and a step or projecting the pattern on the mask onto a photosensitive substrate through said optical system to expose the substrate.

11. A method for fabricating a semiconductor device, liquid crystal display device or thin film magnetic head by using the optical system according to claim 1, comprising:

a step of illuminating a mask on which a predetermined pattern is formed; and a step of projecting the pattern on the mask onto a photosensitive substrate through said optical system to expose the substrate.

12. A projection exposure apparatus for transferring a pattern of a mask to a photosensitive substrate, comprising:

an illumination optical system for emitting a light beam having a wavelength of not more than 250 nm;

a mask stage for supporting said mask illuminated with the illumination light beam from said illumination optical system;

a substrate stage for supporting said photosensitive substrate; and a projection optical system making a position on said mask mounted on said mask stage conjugate to a position on said substrate mounted on said substrate stage and having at least one diffraction optical element having a positive power, at least one lens formed of quartz having a negative power, and at least one lens formed of fluorite having a positive power, wherein a secondary spectrum of said optical system is corrected by the combination of said diffraction optical element, said quartz lens and said fluorite lens, wherein said substrate stage positions said substrate in a direction perpendicular to an optical axis of said projection optical system.

13. An apparatus according to claim 12, wherein said diffraction optical element has a positive power, said lens formed of quartz has a negative power, and said lens formed of fluorite has a positive power.

14. An apparatus according to claim 12, wherein the light beam emitted from said illumination optical system is an Ar-F laser beam.

15. An apparatus according to claim 12, wherein the light beam emitted from said illumination optical system is a Kr-F laser beam.

* * * * *